United States Patent
Shi et al.

(10) Patent No.: US 11,428,975 B2
(45) Date of Patent: Aug. 30, 2022

(54) DISPLAY DEVICE

(71) Applicant: Shenzhen China Star Optoelectronics Semiconductor Display Technology Co., Ltd., Shenzhen (CN)

(72) Inventors: Zhenhua Shi, Shenzhen (CN); Taiyong Yin, Shenzhen (CN); Cen Yi, Shenzhen (CN); Cong Luo, Shenzhen (CN); Shaotuo Tang, Shekh Danoon (IL)

(73) Assignee: Shenzhen China Star Optoelectronics Semicorsductor Display Technology Co., Ltd., Shenzhen (CN)

( * ) Notice: Subject to any disclaimer, the term of this patent is extended or adjusted under 35 U.S.C. 154(b) by 377 days.

(21) Appl. No.: 16/624,375

(22) PCT Filed: Nov. 27, 2019

(86) PCT No.: PCT/CN2019/121136
§ 371 (c)(1),
(2) Date: Dec. 19, 2019

(87) PCT Pub. No.: WO2021/088154
PCT Pub. Date: May 14, 2021

(65) Prior Publication Data
US 2022/0121058 A1    Apr. 21, 2022

(30) Foreign Application Priority Data
Nov. 7, 2019 (CN) .......................... 201911078919.1

(51) Int. Cl.
*G02F 1/1333* (2006.01)
*H05K 7/20* (2006.01)

(52) U.S. Cl.
CPC ... *G02F 1/133385* (2013.01); *H05K 7/20972* (2013.01)

(58) Field of Classification Search
CPC .................. H05K 7/20972; G02F 1/133385
See application file for complete search history.

(56) References Cited

U.S. PATENT DOCUMENTS

| | | | |
|---|---|---|---|
| 10,321,614 B1 * | 6/2019 | Huang | ............... H05K 7/20145 |
| 2008/0083527 A1 | 4/2008 | Horng et al. | |
| 2011/0280005 A1 | 11/2011 | Dunn | |
| 2015/0017905 A1 | 1/2015 | Li et al. | |
| 2016/0195254 A1 | 7/2016 | Dunn et al. | |
| 2017/0023823 A1 | 1/2017 | Dunn et al. | |
| 2017/0188490 A1 | 6/2017 | Dunn et al. | |
| 2019/0324317 A1 * | 10/2019 | Takase | .............. G02F 1/133603 |

(Continued)

FOREIGN PATENT DOCUMENTS

| | | |
|---|---|---|
| CN | 101583824 | 11/2009 |
| CN | 101592807 | 12/2009 |
| CN | 101794034 | 8/2010 |

(Continued)

*Primary Examiner* — Mariceli Santiago

(57) ABSTRACT

The present disclosure provides a display device, including a housing, an air tunnel, and a functional device. The housing includes an air inlet and an air outlet, wherein the air inlet and the air outlet are disposed on two sides of the housing opposite to each other. The air tunnel is disposed in the housing and extends from the air inlet to the air outlet; and the functional device is disposed in the housing and located outside the air tunnel.

8 Claims, 1 Drawing Sheet

(56) References Cited

U.S. PATENT DOCUMENTS

2020/0154597 A1    5/2020  Dunn et al.

FOREIGN PATENT DOCUMENTS

| CN | 102326224 | 1/2012 |
| CN | 103648258 | 3/2014 |
| CN | 203645969 | 6/2014 |
| CN | 104284558 | 1/2015 |
| CN | 106023823 | 10/2016 |
| CN | 208172456 | 11/2018 |
| JP | 2008-015440 | 1/2008 |

* cited by examiner

DISPLAY DEVICE

RELATED APPLICATIONS

This application is a National Phase of PCT Patent Application No. PCT/CN2019/121136 having International filing date of Nov. 27, 2019, which claims the benefit of priority of Chinese Patent Application No. 201911078919.1 filed on Nov. 7, 2019. The contents of the above applications are all incorporated by reference as if fully set forth herein in their entirety.

FIELD AND BACKGROUND OF THE INVENTION

The present disclosure relates to the field of display technologies, and more particularly, to a display device.

For high-brightness liquid crystal displays for outdoor applications, on the one hand, due to higher ambient temperature outdoors (especially in summer), backlight is affected by the ambient temperature and has a higher temperature; on the other hand, because the backlight itself emits more heat and light, an independent air tunnel design is adopted to enhance heat dissipation of the backlight, so that the heat can be dissipated as much as possible to prevent normal function of the display from being affected by overheating backlight.

Generally, a fan, a heat dissipating backlight, a power plate, and a core plate are disposed in a heat dissipation channel of a heat dissipation system. On the one hand, this affects airflow of wind in the heat dissipation channel because the wind is blocked by unevenness of the power plate and the core plate, thereby affecting heat dissipation efficiency. Also, since the wind comes from outside, it inevitably mixes with water vapor and dust. Although filtered by a filtering system, some tiny dust and water vapor inevitably enter the air tunnel, fall into the power plate and the core plate, and affect their lifespan, and even directly causing short circuiting between the power plate and the core plate.

SUMMARY OF THE INVENTION

An object of the present disclosure is to provide a display device, which can solve the problem that dust, water vapor and other substances are easily mixed into the heat dissipation system of the display device in the prior art, which affects the service life of the power plate and the core plate.

To achieve the above object, the present disclosure provides a display device, including a housing, an air tunnel, and a functional device. The housing including an air inlet and an air outlet, wherein the air inlet and the air outlet are disposed on two sides of the housing opposite to each other, the air tunnel disposed in the housing and extends from the air inlet to the air outlet; and the functional device disposed in the housing and located outside the air tunnel.

Furthermore, the display device further including a blower and an ejector fan. The blower fan disposed on a terminal of the air tunnel close to the air inlet; and the ejector fan disposed on a terminal of the air tunnel close to the air outlet.

Furthermore, the display device further including at least one partition plate disposed in the housing and located between the functional device and the air tunnel.

Furthermore, the display device further including a heat dissipation layer disposed on an inner wall of the air tunnel.

Furthermore, the display device further including a surface roughness of the inner wall of the air tunnel is greater than Ra0.04.

Furthermore, the functional device includes a display screen disposed on the air tunnel, the display screen comprising a display surface faces away from the air tunnel; and a motor device disposed on a side of the air tunnel away from the display screen.

Furthermore, the motor device includes a sealed chamber provided on the air tunnel; and a power plate and a core plate are disposed in the sealed chamber.

Furthermore, the motor device further includes a heat dissipation fan disposed in the sealed chamber faces the power plate and the core plate.

Furthermore, the display screen includes a liquid crystal display panel disposed on a side of the display screen away from the air tunnel; and a backlight module disposed on a side of the display screen close to the air tunnel.

Furthermore, the display device further including a cover plate disposed on the display surface of the display screen.

The advantages of the present disclosure are that the display device of the present disclosure independently dispose the air tunnel for heat dissipation, and the functional device is disposed on both sides of the air tunnel, to prevent excessive components from being installed in the air tunnel and blocking the airflow in the air tunnel, thereby reducing the resistance when the air flows in the air tunnel, and improving the heat dissipation efficiency and extending the service life of the display device. At the same time, an independent air tunnel for heat dissipation can isolate the power plate and the core plate, preventing outdoor dust impurities and water vapor from entering the power plate and the core plate through the air and affecting operation, and ensuring their operating stability and extending their service life.

BRIEF DESCRIPTION OF THE SEVERAL VIEWS OF THE DRAWINGS

In order to explain the technical solutions in the embodiments of the present disclosure more clearly, the figures used in the description of the embodiments are briefly introduced below. Obviously, the figures in the following description are just some embodiments of the present disclosure. For those skilled in the art, other figures can be obtained based on these figures without any inventive steps.

DESCRIPTION OF SPECIFIC EMBODIMENTS OF THE INVENTION

The following describes preferred embodiments of the present disclosure with reference to the accompanying figures of the specification to prove that the present disclosure can be implemented. The embodiments of the present disclosure can completely introduce the present disclosure to those skilled in the art and make the technical content thereof clear and easy to understand. The present disclosure may be embodied by many different forms of the embodiments of the present disclosure, and the protection scope of the present disclosure is not limited to the embodiments mentioned in the specification.

In the figures, components having the same structure are denoted by the same numerals, and components having similar structures or functions are denoted by similar numerals. The size and thickness of each component shown in the figures are arbitrarily shown, and the present disclosure does not limit the size and thickness of each component. To make the figure clear, the thicknesses of components are shown exaggerated in parts of the figures.

In addition, the following descriptions of each embodiment of the disclosure are made with reference to additional illustrations, which are used to illustrate specific embodiments of the disclosure that can be implemented. The directional terms mentioned in the present disclosure, for example, "up", "down", "front", "rear", "left", "right", "inside", "outside", "side", etc., are only refers to the direction of the attached figures. Therefore, the terminology used is to better and more clearly explain and understand the present disclosure, rather than to indicate or imply that the device or element must have a specific orientation, construction, or operation, therefore cannot be construed as limiting the present disclosure. In addition, the terms "first", "second", "third", etc. are used for descriptive purposes only and should not be construed to indicate or imply relative importance.

When certain components are described as being "on" another component, the component may be placed directly on the other component, or there may also be an intermediate component on which the component is placed, and the intermediate component is placed on another component. When a component is described as "mounted to" or "connected to" another component, it can be understood as directly "mounted to" or "connected to", or a component is indirectly "mounted to" or "connected to" through an intermediate component to another component.

Embodiment 1

Figure 1:
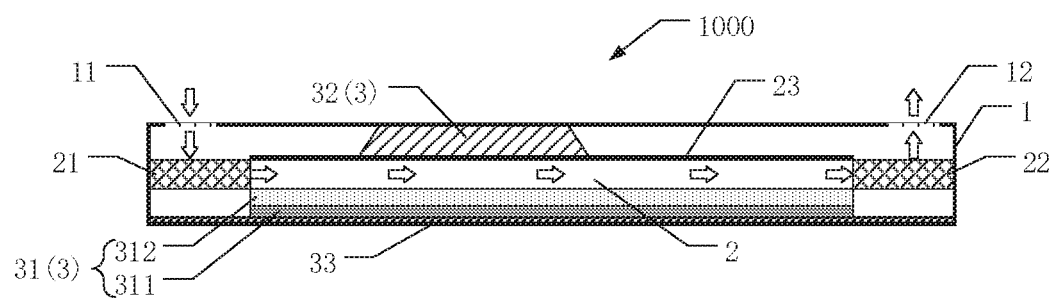
FIG. 1 is a schematic diagram of a layered structure of a display device of embodiment 1 of the present disclosure.

An embodiment of the present disclosure provides a display device 1000. As shown in FIG. 1, the display device 1000 includes a housing 1, an air tunnel 2, a blower fan 21, an ejector fan 22, and a functional device 3. The functional device 3 includes a display screen 31 and a motor device 32.

The display screen 31 is disposed in the housing 1 and has a display surface faces outward of the housing 1. The display screen 31 includes a liquid crystal display panel 311 and a backlight module 312. The liquid crystal display panel 311 is disposed on a side of the display screen 31 close to the display surface thereof, and the backlight module 312 is disposed on the liquid crystal display panel 311.

The liquid crystal display panel 311 includes devices such as an array substrate, a color film substrate, and a liquid crystal housing. There are liquid crystals in the liquid crystal housing. The liquid crystals are a special substance between solid and liquid. They are organic compounds that are liquid under normal conditions, but their molecular arrangement is as regular as solid crystals, therefore, they are named liquid crystals. Another special feature is that under the influence of an electric field, an alignment of liquid crystal molecules changes, which affects changes in light passing through them. The changes in light can be expressed as a change in brightness through the influence of a polarizer. In this way, people control the arrangement of the liquid crystals in the liquid crystal housing by controlling the electric field through the array substrate, and finally control the change of light brightness and darkness, to achieve the purpose of displaying images. Finally, through the cooperation of the color film substrate to change the voltage applied to the liquid crystals, thereby changing the amount of light transmission of a certain color. It can also be said that changing the voltage across the liquid crystals can change their light transmission.

The backlight module 312 is a uniform illumination device located behind the liquid crystal display panel 311. The backlight module 312 has a light emitting surface, and the light emitting surface faces the liquid crystal display panel 311, its light emitting effect will directly affect a visual effect of the liquid crystal display panel 311. The liquid crystal display panel 311 is a passive light emitting device, and does not emit light by itself. The screen or image displayed by the liquid crystal display panel 311 is a result of modulating the light provided by the backlight module 312 below it. The backlight module 312 includes an optical film such as backlight sources, a back plate, a light guide plate, and a reflective sheet. The back plate is disposed on a side of the backlight module 312 away from its light emitting surface, and is used to protect the overall structure of the backlight module 312. The backlight sources are generally arranged on one or both sides of the entire backlight module 312. The backlight source is generally a cold cathode fluorescent lamp (CCFL) or a light emitting diode (LED) light bar. The cold cathode fluorescent light tube is a line light source, and the light emitting diode light bar is a point light source. The line light source and the point light source are converted into area light source by using the light guide plate. The light guide plate is made of acrylic with a smooth surface by injection molding, and then using a material with high reflection and no light absorption to print diffusion points on the bottom surface of the light guide plate by screen printing. The CCFL or the LED light bar is located on the side of the light guide plate, and the light emitted by it is introduced into the light guide plate by reflection. When the light emitted to the diffusion point, the reflected light will diffuse to various angles, and then the light be damaged reflection conditions will be emitted from the front of the light guide plate with a variety of dense, diffusive points of different sizes to make the light guide plate emit light uniformly. The reflection sheet is used to reflect the light that is directed to the bottom surface back to the light guide plate, to improve the light use efficiency. The light guide plate and the reflection sheet are used to guide the scattering and reflection directions of light, to prevent light from being emitted from areas other than the light emitting surface, improve a brightness of the backlight module 312, and ensure the uniformity of the brightness of the liquid crystal display panel 311. These optical films cooperate to improve a frontal brightness of the backlight module 312, improve the angular distribution of light without increasing the number of light sources, focus the light on the frontal angle, reduce losses, and increase the luminous flux of total output light and an axial brightness of the backlight module 312.

Figure 2:
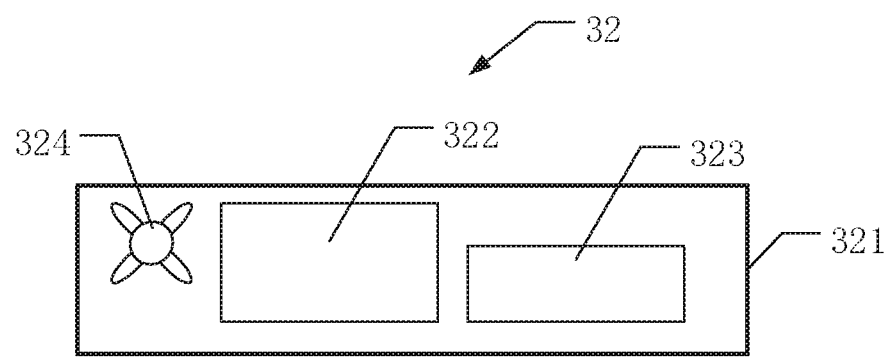
FIG. 2 is a schematic diagram of an internal structure of a motor device of embodiment 1 of the present disclosure.

The motor device 32 is disposed on the display screen 31. As shown in FIG. 2, the motor device 32 includes a sealed chamber 321, a power plate 322, and a core plate 323. The power plate 322 and the core plate 323 are disposed in the sealed chamber 321. The power plate 322 is an important part of the driving system of the display device 1000, and is responsible for controlling the power of the driving circuit, and boosting the transformer to provide enough driving voltage when lighting, and keeping the output current stable when the circuit is operating. The display device 1000 needs a digitized video signal to display an image. The core plate 323 converts an analog signal into a digital signal (or from one digital signal to another digital signal) and sends the converted digital signal to the array substrate of the display screen 31 to control the display screen of the liquid crystal display panel 311. The sealed chamber 321 seals the power plate 322 and the core plate 323 inside, prevents external moisture and dust from entering, prevents short circuit between the power plate 322 and the core plate 323, and prolongs service life of the power plate 322 and the core plate 323.

The sealed chamber 321 further includes a heat dissipation fan 324, which faces the heat concentration area of the power plate 322 and the core plate 323 to ensure heat dissipation in the heat concentration area and prevent damage to the device caused by excessive heat accumulation, further extending the service life of the power plate 322 and the core plate 323.

The display device 1000 further includes a cover plate 33. The cover plate 33 is generally a glass cover plate 33, which covers the display surface of the display screen 31 for protecting while not affecting the display of the display device 1000 and protecting the display screen 31.

The housing 1 has an air inlet 11 and an air outlet 12. The air inlet 11 and the air outlet 12 are respectively disposed on the housing 1 and correspondingly located on two sides of the display screen 31. The air tunnel 2 extends from the air inlet 11 to the air outlet 12 and is disposed between the display screen 31 and the motor device 32. The blower fan 21 is disposed on a terminal of the air tunnel 2 close to the air inlet 11, and has an air in-hole and an air out-hole. The air in-hole is toward to the air inlet 11, and the air out-hole is toward to the air tunnel 2. The ejector fan 22 is disposed on a terminal of the air tunnel 2 close to the air outlet 12, and has an air suction-hole and an air ejector-hole. The air suction-hole is toward to the air tunnel 2, the air ejector-hole is toward to the air outlet 12. The blower fan 21 draws air outside the housing 1 from the air inlet 11 through the air in-hole and blows air into the air tunnel 2 through the air out-hole. The ejector fan 22 suction air from the air tunnel 2 through the air suction-hole, and drawn air out from the air outlet 12 of the housing 1 through the air ejector-hole. The air circulates in the air tunnel 2 and takes away the heat generated by the functional devices 3 disposed on the upper side and the lower side of the air tunnel 2.

The display device 1000 further includes a partition plate 23 which blocks the air tunnel 2 from the motor device 32. The partition plate 23 and the back plate of the backlight module 312 block the air tunnel 2, and form an independent heat dissipation channel. When external air enters the air tunnel 2, dust and air mixed in the air, and water vapor does not enter the motor device 32, affects the operation of the power plate 322 and the core plate 323 of the motor device 32.

To improve the heat dissipation efficiency, the surface roughness of an inner wall of the air tunnel 2 can be enhanced, that is, a side of the partition plate 23 toward the air tunnel 2, and a side of the backlight module 312 toward the air tunnel 2. A surface roughness of the inner wall of the air tunnel is greater than Ra0.04, to increase its surface area to achieve the purpose of improving heat dissipation efficiency.

A display device 1000 of an embodiment of the present disclosure is independently provided with the air tunnel 2 for heat dissipation, which prevents excessive components from blocking the air flow in the air tunnel 2 and reduces the resistance encountered by the air flow, thereby improving the heat dissipation efficiency of the device 1000 to prevent heat accumulation from affecting the operating reliability and service life of the entire machine. At the same time, the air tunnel 2 independently for heat dissipation can isolate the power plate 322 and the core plate 323, preventing outdoor dust impurities and water vapor from entering the power plate 322 and the core plate 323 through the air to affect the operation, and ensuring their operating stability and extending their service life.

Embodiment 2

Figure 3:
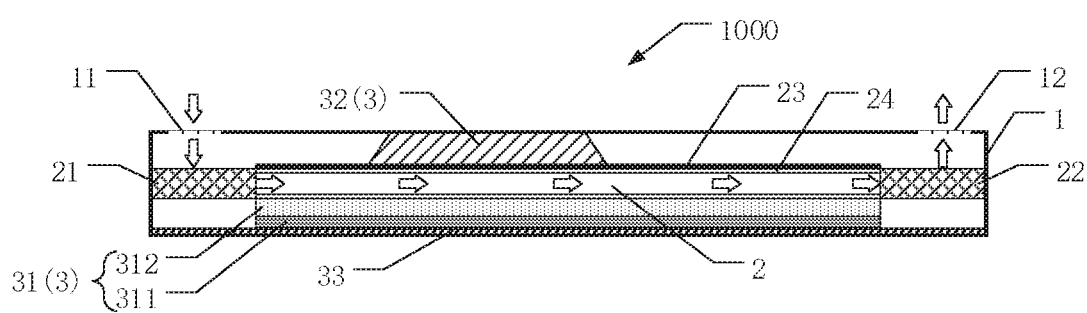
FIG. 3 is a schematic diagram of a layered structure of a display device of embodiment 2 of the present disclosure.

A display device 1000 is provided in an embodiment of the present disclosure. As shown in FIG. 3, the layered structure of the display device 1000 in this embodiment of the present disclosure is similar to the layered structure in embodiment 1, but in this embodiment, an inner wall of the air tunnel 2 is provided with a heat dissipation layer 24, that is, a side of the partition plate 23 toward the air tunnel 2 and a side of the backlight module 312 toward the air tunnel 2 are covered with the heat dissipation layer 24. The heat dissipation layer 24 may be a material with excellent thermal conductivity such as a heat dissipation paint and graphene, and is used to improve the heat dissipation efficiency of the display device 1000.

Embodiment 1 and embodiment 2 of the present disclosure only include one layer of the partition plate 23, but in other embodiments of the present disclosure, there may be two layers of the partition plates 23, which are respectively provided between the motor device 32 and the air tunnel 2 and between the display screen 31 and the air tunnel 2. The other layered structures are similar to the display device 1000 in the embodiment of the present disclosure, and therefore are not described in detail here. Based on the embodiments in the present disclosure, all other embodiments obtained by a person of ordinary skill in the art without inventive steps shall fall within the protection scope of the present disclosure.

Although the invention is described herein with reference to specific embodiments, it can be understood that these embodiments are merely examples of the principles and applications of the present disclosure. It should therefore be understood that many modifications can be made to the exemplary embodiments and that other arrangements can be devised without departing from the spirit and scope of the present disclosure as defined by the appended claims. It can be understood that different dependent claims and features described herein may be combined in a manner different from that described in the original claims. It can also be understood that features described in connection with separate embodiments may be used in other described embodiments.

What is claimed is:

1. A display device, comprising:
    a housing, comprising an air inlet and an air outlet, wherein the air inlet and the air outlet are disposed on two sides of the housing opposite to each other;
    an air tunnel disposed in the housing and extending from the air inlet to the air outlet;
    a first functional device disposed in the housing and located on an upper side of the air tunnel;
    at least one partition plate disposed in the housing and located between the first functional device and the air tunnel; and
    a second functional device disposed in the housing and located below the air tunnel, wherein the second functional device comprises a backlight module;
    wherein the air tunnel is formed by a side of the partition plate toward the backlight module and a side of the backlight module toward the partition plate; and
    wherein a surface roughness of the side of the partition plate toward the backlight module and a surface roughness of the side of the backlight module toward the partition plate are greater than Ra0.04.

2. The display device as claimed in claim 1, further comprising:
a blower fan disposed on a terminal of the air tunnel close to the air inlet; and
an ejector fan disposed on a terminal of the air tunnel close to the air outlet.

3. The display device as claimed in claim 1, further comprising:
a heat dissipation layer disposed on an inner wall of the air tunnel.

4. The display device as claimed in claim 1, wherein the first functional device comprises a motor device, and wherein the second functional device comprises a display screen disposed on a side of the backlight module away from the air tunnel.

5. The display device as claimed in claim 4, wherein the motor device comprises:
a sealed chamber provided on the air tunnel; and
a power plate and a core plate disposed in the sealed chamber.

6. The display device as claimed in claim 5, wherein the motor device further comprises:
a heat dissipation fan disposed in the sealed chamber and facing the power plate and the core plate.

7. The display device as claimed in claim 4, wherein the display screen comprises:
a liquid crystal display panel disposed on a side of the display screen away from the air tunnel.

8. The display device as claimed in claim 4, further comprising a cover plate disposed on a display surface of the display screen.

* * * * *

UNITED STATES PATENT AND TRADEMARK OFFICE
CERTIFICATE OF CORRECTION

PATENT NO. : 11,428,975 B2
APPLICATION NO. : 16/624375
DATED : August 30, 2022
INVENTOR(S) : Zhenhua Shi et al.

It is certified that error appears in the above-identified patent and that said Letters Patent is hereby corrected as shown below:

On the Title Page

Item (72) Inventors, Line 4:
"Shekh Danoon (IL)"
Should be changed to:
-- Shenzhen (CN) --

Item (73) Assignee:
"Shenzhen China Star Optoelectronics Semicorsductor Display Technology Co., Ltd."
Should be changed to:
-- Shenzhen China Star Optoelectronics Semiconductor Display Technology Co., Ltd. --

Signed and Sealed this
Thirteenth Day of December, 2022

Katherine Kelly Vidal
*Director of the United States Patent and Trademark Office*